United States Patent
Su et al.

(10) Patent No.: US 12,418,997 B2
(45) Date of Patent: Sep. 16, 2025

(54) DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jingchang Su, Beijing (CN); Xin Bi, Beijing (CN); Jianjun Wu, Beijing (CN); Wen Huang, Beijing (CN); Xianfeng Yang, Beijing (CN); Jiahua Wang, Beijing (CN); Kun Huang, Beijing (CN); Xianlei Bi, Beijing (CN); Hao Cheng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/028,242

(22) PCT Filed: May 12, 2022

(86) PCT No.: PCT/CN2022/092502
§ 371 (c)(1),
(2) Date: Mar. 24, 2023

(87) PCT Pub. No.: WO2023/216189
PCT Pub. Date: Nov. 16, 2023

(65) Prior Publication Data
US 2024/0306324 A1 Sep. 12, 2024

(51) Int. Cl.
*H05K 5/02* (2006.01)
*H05K 5/03* (2006.01)

(52) U.S. Cl.
CPC ............. *H05K 5/0217* (2013.01); *H05K 5/03* (2013.01)

(58) Field of Classification Search
CPC ........ H05K 5/0217; H05K 5/03; G06F 1/163; G06F 1/1626; G02F 1/133308; G02F 1/133317; G02F 1/1333
See application file for complete search history.

(56) References Cited

U.S. PATENT DOCUMENTS 10,345,760 B2 7/2019 Kayano
10,440,164 B2 * 10/2019 Yu .......................... G06F 1/1637
(Continued)

FOREIGN PATENT DOCUMENTS

| CN | 104536517 A | 4/2015 |
| CN | 104866139 A | 8/2015 |

(Continued)

OTHER PUBLICATIONS

Written Opinion issued Dec. 12, 2022, in counterpart International Application No. PCT/CN2022/092502, 3pp.

(Continued)

*Primary Examiner* — Sagar Shrestha
(74) *Attorney, Agent, or Firm* — XSENSUS LLP

(57) ABSTRACT

The present disclosure is related to a display device. The display device includes a middle frame, a display panel and a supporting member. The middle frame is provided with a first mating surface. The display panel includes a display substrate and a cover plate. A first notch is provided at a side of an edge of the cover plate close to the first mating surface. The first notch extends along a thickness direction of the cover plate. An orthographic projection of the display substrate on the cover plate at least partially overlaps an orthographic projection of the first mating surface on the cover plate. The supporting member includes a first sup- (Continued)

porting section and a second supporting section, the first supporting section is connected to the first mating surface, and the second supporting section is partially arranged in the first notch.

16 Claims, 6 Drawing Sheets

(56) References Cited

U.S. PATENT DOCUMENTS

| | | | | |
|---|---|---|---|---|
| 10,521,040 | B2* | 12/2019 | Lin | G06F 1/1626 |
| 10,712,782 | B2* | 7/2020 | Tang | G06F 1/1656 |
| 11,310,930 | B2* | 4/2022 | Choi | G06F 1/1637 |
| 2005/0111307 | A1* | 5/2005 | Saaski | G04G 17/02 |
| | | | | 368/314 |
| 2014/0239781 | A1* | 8/2014 | Allore | H05K 5/03 |
| | | | | 312/223.1 |
| 2017/0177032 | A1* | 6/2017 | Cheng | G06F 1/1656 |
| 2018/0173166 | A1 | 6/2018 | Kayano | |
| 2018/0196559 | A1* | 7/2018 | Lin | G06F 1/1626 |
| 2018/0343332 | A1* | 11/2018 | Kim | H04M 1/026 |
| 2022/0011623 | A1* | 1/2022 | Lee | G02F 1/133334 |

FOREIGN PATENT DOCUMENTS

| | | |
|---|---|---|
| CN | 104991366 | 10/2015 |
| CN | 106843386 A | 6/2017 |
| CN | 104536517 B | 3/2018 |
| CN | 108227459 | 6/2018 |
| CN | 208126252 U | 11/2018 |
| CN | 109951972 | 6/2019 |
| CN | 209448765 U | 9/2019 |
| CN | 111245982 A | 6/2020 |
| CN | 211878383 U | 11/2020 |
| CN | 112468621 | 3/2021 |
| CN | 214014273 S | 8/2021 |
| CN | 214587755 U | 11/2021 |
| WO | 2022/111100 | 6/2022 |

OTHER PUBLICATIONS

The First Office Action mailed Apr. 30, 2025, in Chinese Application No. 202280001179.5, 17 pages including English translation.

* cited by examiner

DISPLAY DEVICE

CROSS-REFERENCE TO RELATED APPLICATION

The present application is based on PCT filing PCT/CN2022/092502, filed May 12, 2022, the entire contents of which are incorporated herein by reference.

TECHNICAL FIELD

The present disclosure relates to the display technical field, and in particular, to a display device.

BACKGROUND

At present, according to market demands, more and more consumers have increasingly high requirements on the frame of display devices, and pursue extremely narrow bezel.

When an existing display device is assembled, a relatively wide connection surface is reserved on a cover plate to connect the display panel with a middle frame, resulting in a large frame of the display device.

It should be noted that the information disclosed in the background section above is only used to enhance the understanding of the background of the present disclosure, and therefore may include information that does not constitute the prior art known to those skilled in the art.

SUMMARY

The present disclosure aims at providing a display device to overcome the shortcomings in the above-mentioned related arts.

According to an aspect of the present disclosure, there is provided a display device, including a display panel, a middle frame and a supporting member.

The middle frame is provided with a first mating surface.

The display panel includes a display substrate and a cover plate arranged on a side of the display substrate. A first notch is provided at a side of an edge of the cover plate close to the first mating surface, the first notch extends along a thickness direction of the cover plate, and an orthographic projection of the display substrate on the cover plate at least partially overlaps an orthographic projection of the first mating surface on the cover plate.

The supporting member includes a first supporting section and a second supporting section which are connected sequentially, wherein the first supporting section is connected to the first mating surface, and the second supporting section is partially arranged in the first notch.

In an example of the present disclosure, a thickness of the second supporting section is less than or equal to a distance between a side surface of the first notch and a side surface of the cover plate.

In an example of the present disclosure, a second notch is provided at a side of the first notch, the second notch extends perpendicular to a thickness direction of the cover plate, and the supporting member further includes a third supporting section which is connected to an end away from the first supporting section, and the third supporting section is snap-fitted in the second notch.

In an example of the present disclosure, the first supporting section is spaced apart from the display substrate.

In an example of the present disclosure, the display substrate has a display region and a binding region located at a periphery of the display region, and the orthographic projection of the first mating surface on the cover plate at least partially overlaps an orthographic projection of the binding region on the cover plate.

In an example of the present disclosure, a width of the first supporting section is greater than or equal to a width of the first mating surface, and the orthographic projection of the binding region on the cover plate is located in an orthographic projection of the first supporting section on the cover plate.

In an example of the present disclosure, a width of the third supporting section is smaller than a width of the first supporting section.

In an example of the present disclosure, the middle frame is provided with an installation notch, the cover plate is arranged in the installation notch, and the first mating surface is an end surface of the installation notch; and the middle frame further includes a second mating surface, the second mating surface is a side surface of the installation notch, and the first notch and the second notch are arranged at a position of the side surface of the cover plate which is opposite to the second mating surface.

In an example of the present disclosure, the supporting member is attached to the first side surface and divided into at least two parts along an extending direction of the first side surface.

In an example of the present disclosure, a flexible buffer layer is provided between the third supporting section and the second notch.

In an example of the present disclosure, the supporting member is made of stainless steel.

In an example of the present disclosure, a third notch is provided at the second mating surface, and the supporting member further includes a fourth supporting section, and the fourth supporting section is snap-fitted in the third notch.

In an example of the present disclosure, the second notch extends continuously along an extending direction of an edge of the cover plate.

In an example of the present disclosure, the second notch includes a plurality of recesses, and the plurality of recesses are distributed at intervals along the extending direction of the side surface of the cover plate.

In an example of the present disclosure, the edge of the cover plate is arc-shaped, and a height of the edge of the cover plate away from the first mating surface is gradually decreased from an end away from close to a center of the cover plate to an end away from the center.

In an example of the present disclosure, the first supporting section is adhered to the first mating surface.

According to another aspect of the present disclosure, there is provided a display device, including the display panel according to another aspect of the present disclosure.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

DETAILED DESCRIPTION

Figure 1:
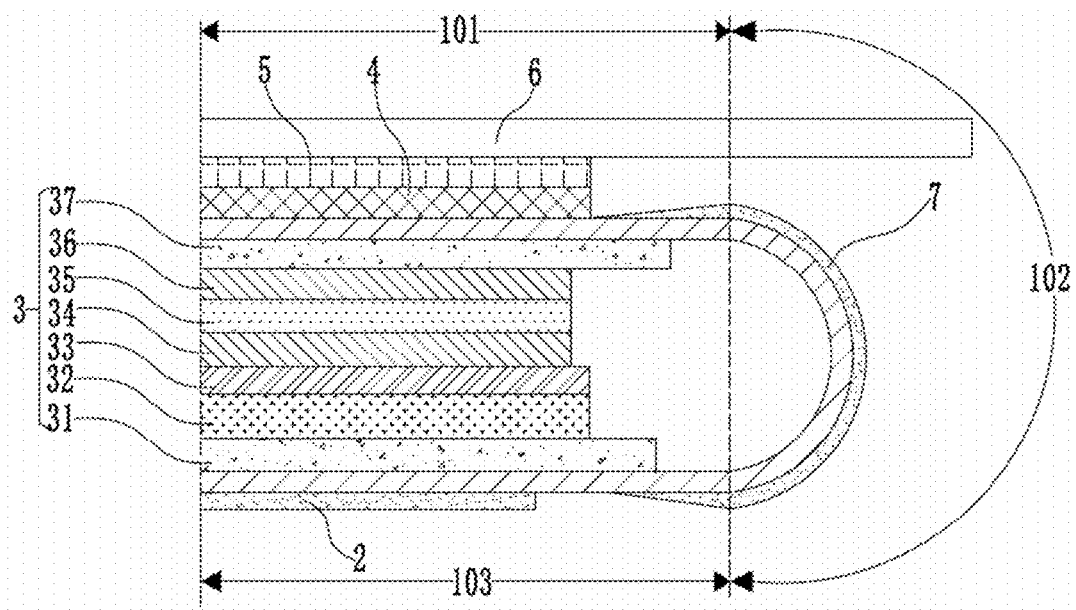
FIG. 1 is a cross-sectional structure diagram of a display panel involved in an embodiment of the present disclosure.

Example embodiments will now be described more fully with reference to the accompanying drawings. However, the example embodiments can be implemented in various forms and should not be construed as limited to the examples set forth herein; rather, providing these embodiments makes the present disclosure more comprehensive and complete, and conveys the concepts of the example embodiments comprehensively to those skilled in the art. The same reference numerals in the drawings denote the same or similar structures, and thus their repeated descriptions will be omitted. Furthermore, the drawings are merely schematic illustrations of the present disclosure and are not necessarily drawn to scale.

Although relative terms such as "upper" and "lower" are used in the specification to describe a relative relationship of one component shown in the drawings to another component, these terms are used in the specification only for convenience, and are for example based on the direction(s) as illustrated in the drawings. It will be appreciated that if the illustrated device is turned over so that it is upside down, then a component described as being "upper" will become an element that is "lower". When a structure is "on" another structure, it may mean that the structure is integrally formed on another structure, or that the structure is "directly" placed on another structure, or that the structure is "indirectly" placed on another structure through other structure(s).

The terms "a", "an", "the", "said" and "at least one" are used to indicate the presence of one or more elements/components/etc. The terms "includes/include" and "have/has" are used to indicate open-ended inclusion and to mean that additional elements/components/etc. may exist in addition to the listed elements/components/etc. The terms "first", "second" and "third" are used as markers only and are not quantitative restrictions on their associated objects.

As shown in FIG. 1, an existing display device includes a display panel and a middle frame 8. The display panel includes a display substrate 1. The display substrate 1 includes a display portion 101, a first bending portion 102, and a binding portion 103. The display portion 101 and the binding portion 103 are adjacent to both sides of the first bending portion 102, the binding portion 103 is adjacent to a side of the first bending portion 102 away from the display portion 101 and is bonded, through the first bending portion 102, to a side of the display portion 101 which is the back of the display surface. The display portion 101 may perform the display function of the display panel, and there is a display device inside the display portion 101. The binding portion 103 is provided with a circuit board 2, and the circuit board 2 is connected with metal traces, and the metal traces extend through the first bending portion 102 to the display portion 101 and connected to the display device to realize the binding with the binding portion 103.

It should be noted that the display panel may be an LCD display panel or an OLED display panel.

Figure 2:
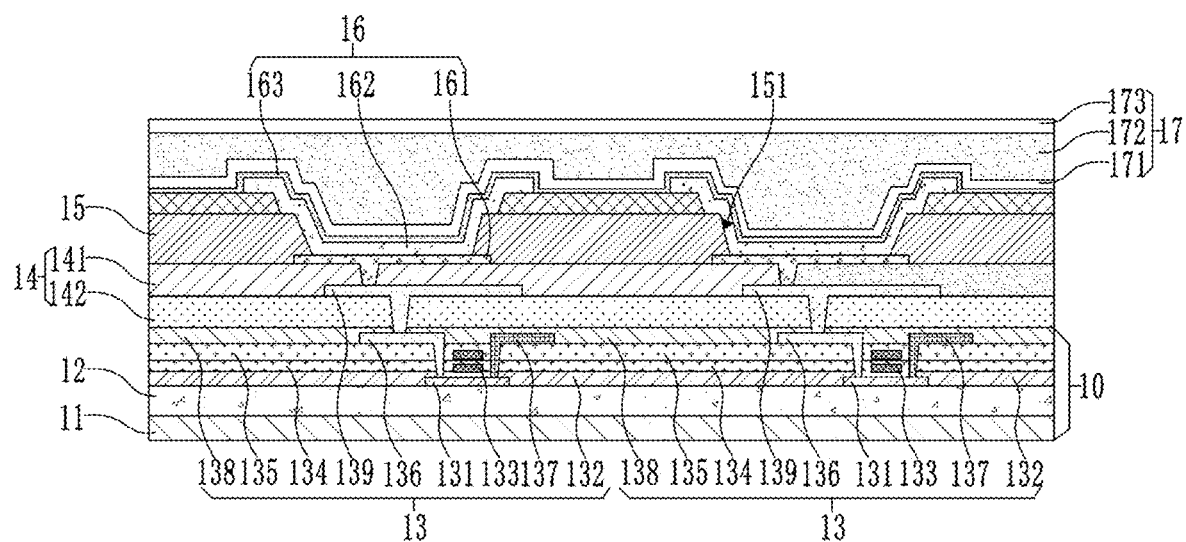
FIG. 2 is a cross-sectional structure diagram of a display substrate involved in an embodiment of the present disclosure.

The display device generally adopts an OLED display panel. As shown in FIG. 2, an OLED display panel generally includes a driving backplane 10, a planarization layer group 14, and a pixel layer 16. The driving backplane 10 may include a base substrate 11 and a driving circuit layer. The driving circuit layer is arranged on a side of the base substrate 11. The planarization layer group 14 is arranged on a side of the driving circuit layer away from the base substrate 11. The pixel layer 16 is arranged on a side of the planarization layer group 14 away from the base substrate 11.

The OLED display panel may further include a first buffer layer 12, and the first buffer layer 12 is arranged between the base substrate 1I and the driving circuit layer.

The base substrate 11 may be a base substrate 11 of inorganic material, or may be a base substrate 11 of organic material. For example, in one embodiment of the present disclosure, the material of the base substrate 11 may be a glass material such as soda-lime glass, quartz glass, sapphire glass, or may be a metallic material such as stainless steel, aluminum, nickel, etc.

In another embodiment of the present disclosure, the base substrate 11 may also be a flexible base substrate. For example, the material of the base substrate 11 may be polyimide (PI). The base substrate 11 may also be a composite of multiple layers of materials. For example, in one embodiment of the present disclosure, the base substrate 11 may include a bottom film, a pressure-sensitive adhesive layer, a first polyimide layer and a second polyimide layer which are stacked sequentially.

In embodiments of the present disclosure, the driving circuit layer is provided with driving circuits for driving sub-pixels. In the driving circuit layer, any one of the driving circuits may include a transistor and a storage capacitor. Further, the transistor may be a thin film transistor 13, and the thin film transistor 13 may be selected from a top-gate thin film transistor, a bottom-gate thin film transistor or a double-gate thin film transistor. Taking a top-gate thin film transistor as an example, the thin film transistor 13 may include an active layer 131, a gate insulating layer 132, a gate electrode 133, a first electrode 136 and a second electrode 137.

The active layer 131 is arranged on a side of the substrate 11. The material of the active layer 131 may be amorphous silicon semiconductor material, low temperature polysilicon semiconductor material, metal oxide semiconductor material, organic semiconductor material or other types of semiconductor materials. The thin film transistor 13 may be an N-type thin film transistor or a P-type thin film transistor. The active layer 131 may include a channel region and two doped regions of different doping types located on both sides of the channel region.

The gate insulating layer 132 may cover the active layer 131 and the base substrate 11. The material of the gate insulating layer 132 is an insulating material such as silicon oxide.

The gate electrode 133 is arranged on a side of the gate insulating layer 132 away from the base substrate 11, and is directly facing the active layer 131. That is, the projection of the gate electrode 133 on the base substrate 11 is located within the projection range of the active layer 131 on the base substrate. For example, the projection of the gate electrode 133 on the base substrate 11 coincides with the projection of the channel region of the active layer 131 on the base substrate 11.

The thin film transistor 13 further includes an interlayer insulating layer 134. The interlayer insulating layer 134 covers the gate electrode 133 and the gate insulating layer 132. The thin film transistor 13 further includes an interlayer dielectric layer 135. The interlayer dielectric layer 135 is arranged on a side of the interlayer insulating layer 134 away from the base substrate 11. Both the interlayer insulating layer 134 and the interlayer dielectric layer 135 are insulating materials, but the materials of the interlayer insulating layer 134 and the interlayer dielectric layer 135 may be different.

The first electrode 136 and the second electrode 137 are arranged on a surface of the interlayer dielectric layer 135 away from the base substrate 11. The first electrode 136 may be a first source electrode, and the second electrode 137 may be a drain electrode. The first electrode 136 and the second electrode 137 are connected to the active layer 131. For example, the first electrode 136 and the second electrode 137 are respectively connected to two corresponding doped regions of the active layer 131 through via holes.

A protection layer 138 is provided on a side of the first electrode 136 away from the base substrate 11. The protection layer 138 covers the first electrode 136 and the second electrode 137. A planarization layer group 14 is provided on a side of the first electrode 136 and the second electrode 137 away from the base substrate 11. The planarization layer group 14 is arranged on a side of the protective layer 138 away from the base substrate 11. The planarization layer group 14 covers the protection layer 138, and a surface of the planarization layer group 14 away from the base substrate 11 is a flat surface.

Specifically, the planarization layer group 14 may include a first planarization layer 141 covering the protection layer 138. The display panel may further include a third electrode 139. A second planarization layer 142 is provided on a side of the third electrode 139 away from the base substrate 21. The second planarization layer 142 covers the first electrode 136, the second electrode 137 and a side of the first planarization layer 141 away from the base substrate 11. The third electrode 139 is connected to the first electrode 136 through a via hole. It should be noted that the third electrode 139 may be a second source electrode.

On a side of the planarization layer group 14 away from the base substrate 11, a pixel defining layer 15 and a pixel layer may be provided. The pixel defining layer 15 has a plurality of pixel openings 151. The pixel layer 16 includes a plurality of sub-pixels, and the plurality of sub-pixels are respectively arranged inside the plurality of pixel openings 151. An array of plurality of sub-pixels is distributed on a side of the driving backplane 10 away from the base substrate 11. Specifically, sub-pixels may be located on a side of the planarization layer group 14 away from the base substrate 11. It should be noted that the sub-pixels may include red sub-pixels, green sub-pixels and blue sub-pixels according to different luminescent colors.

The pixel layer 16 may include a plurality of pixel electrodes 161, a light-emitting layer 162 and a common electrode 163. The pixel electrode 161 is located on the surface of the driving backplane 10 away from the base substrate 11, and the light-emitting layer 162 is arranged on the surface of the pixel electrodes 161 away from the base substrate 11, and the common electrode 163 is arranged on the surface of the light-emitting layer 162 away from the base substrate 11.

A pixel electrode 161 is connected to the first electrode 136 or the third electrode 139. When the thin film transistor 13 only includes the first electrode 136 and the first planarization layer 141, the pixel electrode 161 is connected to the first electrode 136 through a via hole in the first planarization layer 141, and the pixel defining layer 15 is set to cover the first electrode 161, the first planarization layer 141. When the thin film transistor 13 further includes the third electrode 139 and the second planarization layer 142, the pixel electrode 161 is connected to the third electrode 139 through the via hole in the second planarization layer 142, and the pixel defining layer 15 is set to cover the third electrode 139 and the second planarization layer 142.

The common electrode 163 may be used as a cathode, and the pixel electrode 161 may be used as an anode. The pixel electrode 161 is connected to a positive electrode of a power supply, and the common electrode 163 is connected to a negative electrode of the power supply. Signals may be applied through the pixel electrode 161 and the common electrode to drive the light-emitting layer 162 to emit light, so as to display images. The specific light-emitting principle will not be described in detail here. The light-emitting layer 162 may include an electroluminescent organic light-emitting material. For example, the light-emitting layer 162 may include an auxiliary layer and a light-emitting material layer sequentially stacked on the pixel electrode 161. Generally, a pattern region is provided on a mask plate, and the auxiliary layers of sub-pixels of different colors and the light-emitting layers 162 of sub-pixels of different colors are formed by evaporation and other processes.

In addition, the display panel in embodiments of the present disclosure may further include an encapsulation layer 17, which is arranged on a side of the pixel layer 16 away from the base substrate 11, so as to encapsulate the pixel layer 16 and prevent water and oxygen erosion. The encapsulation layer 17 may be a single-layer or multi-layer structure, and the material of the encapsulation layer 17 may include organic or inorganic materials, which are not specifically limited here.

In an embodiment, the encapsulation layer 17 may include a first inorganic encapsulation layer 171, an organic encapsulation layer 172 and a second inorganic encapsulation layer 173. The first inorganic encapsulation layer 171 is arranged on a side of the pixel layer 16 away from the base substrate 11. The organic encapsulation layer 172 is arranged on a side of the first inorganic encapsulation layer 171 away from the base substrate 11. The second inorganic encapsulation layer 173 is arranged on a side of the organic encapsulation layer 172 away from the base substrate 11.

As shown in FIG. 1, a supporting layer group 3 is provided between the display portion 101 and the binding portion 103 of the display substrate 1. In order to closely bond the display substrate 1 and the supporting layer group 3 to obtain a good display effect, the profiled one end of the display substrate 1 is bonded to one side of the supporting layer group 3, and the other end of the display substrate 1 is bonded to the opposite side of the supporting layer group 3. Specifically, the supporting layer group 3 has a first surface and a second surface oppositely arranged. The display substrate 1 includes a first straight portion, a first bent portion 102 and a second straight portion connected in sequence. The first straight portion is bonded to the first surface of the supporting layer group 3, and the second straight portion is bonded to the second surface of the supporting layer group 3.

The supporting layer group 3 includes a first back film 31, a supporting block 32, a supporting plate 33, a first adhesive layer 34, a second buffer layer 35, a second adhesive layer 36 and a second back film 37 arranged in sequence. The supporting block 32 is arranged on a side of the first back film 31. The supporting plate 33 is arranged on a side of the supporting block 32 away from the first back film 31. The first adhesive layer 34 is arranged on a side of the supporting plate 33 away from the first back film 31. The second buffer layer 35 is arranged on a side of the first adhesive layer 34 away from the first back film 31. The second adhesive layer 36 is arranged on a side of the second buffer layer 35 away from the first back film 31. The second back film 37 is arranged on a side of the second adhesive layer 36 away from the first back film 31. In order to ensure the supporting strength, the materials of the supporting plate 33 and the supporting block 32 may be metal materials.

It should be noted that the first surface of the supporting layer group 3 refers to a surface of the second back film 37 away from the first back film 31, and the second surface of the supporting layer group 3 refers to the other surface which is directly opposite to the surface of the first back film 31. The first straight portion is bonded to one side of the second back film 37 away from the first back film 31, and the second straight portion is bonded to the other side opposite to the one side of the first back film 31. Specifically, a part of the base substrate 11 located at the binding portion 103 is attached to the first back film 31, and a part of the base substrate 11 located at the display portion 101 is attached to the second back film 37.

A polarizer 4 is provided on a side of the display substrate 1 away from the display portion 101. Specifically, a part of the encapsulation layer 17 located in the display portion 101 is attached to the polarizer 4. A tactile control layer may also be provided on a side of the encapsulation layer 17 located in the display portion 101 away from the supporting layer group 3. The polarizer 4 is provided on a side of the tactile control layer away from the supporting layer group 3. The side of the polarizer 4 away from the display portion 101 is provided with a third adhesive layer 5. A side of the third adhesive layer 5 away from the display portion 101 is bonded to the cover plate 6. The cover plate 6 can be adhered to the display substrate 1 mounted on its lower surface, and can effectively protect the display substrate 1.

Figure 3:
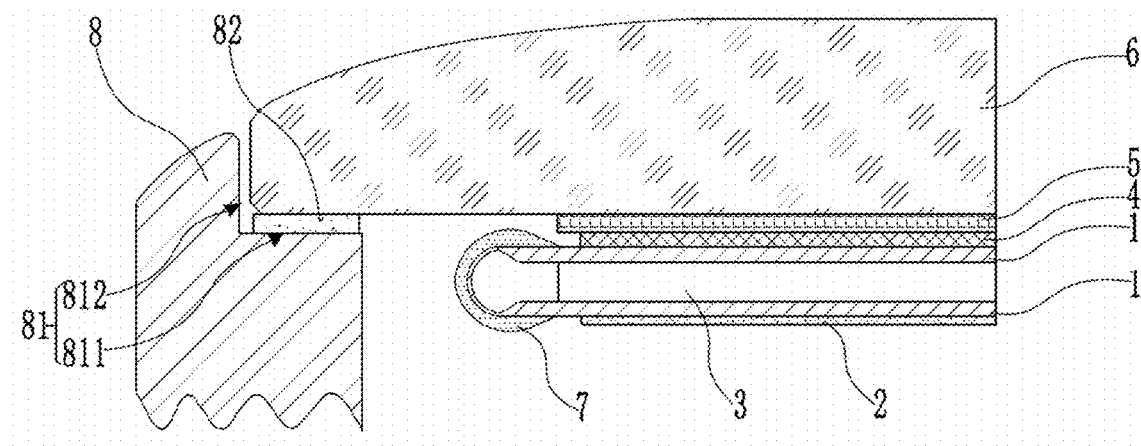
FIG. 3 is a partial schematic diagram of a display device involved in an embodiment of the present disclosure.

As shown in FIG. 3, when the display panel is connected to a middle frame 8, a first mating surface 811 is provided on the middle frame 8, and a relative wide connection surface is reserved on a side of the cover plate 6 close to the middle frame 8. The third adhesive layer 5 is provided between the connection surface and the first mating surface 811 to adhere the connection surface and the first mating surface 81, thus assembling the cover plate 6 and the middle frame 8 together. When this method is used for connection, the width of the reserved connection surface is usually relatively large, resulting in a large bezel of the display device.

In view of the above, embodiments of the present disclosure provide a display device. As shown in FIG. 4 to FIG. 9, the display device includes a display panel, a middle frame 8 and a supporting member 9. The middle frame 8 is provided with a first mating surface 811. The display panel includes a display substrate 1 and a cover plate 6 arranged on a side of the display substrate 1. A first notch 61 is provided at a side of an edge of the cover plate 6 close to the first mating surface 811. The first notch 61 extends along the thickness direction of the cover plate 6. The orthographic projection of the display substrate 1 on the cover plate 6 and the orthographic projection of the first mating surface 811 on the cover plate 6 at least partially overlap. The supporting member 9 includes a first supporting section 91 and a second supporting section 92 connected sequentially. The first supporting section 91 is connected to the first mating surface 811. The second supporting section 92 is partially arranged in the first notch 61.

The middle frame 8 is provided with the first mating surface 811. The first notch 61 is provided at the side of the edge of the cover plate 6 close to the first mating surface 811. The supporting member 9 includes the first supporting section 91 and the second supporting section 92 connected sequentially. The first supporting section 91 is connected to the first mating surface 811, and the second supporting section 92 is partially arranged in the first notch 61. The cover plate 6 and the middle frame 8 are connected together through the supporting member 9, and the first mating surface 811 is moved inwardly to be under the display substrate 1, so that the orthographic projection of the first mating surface 811 of the middle frame 8 on the cover plate 6 at least partially overlaps the orthographic projection of the display substrate 1 on the cover plate 6 to reduce the distance between the display substrate 1 and a side of a side surface of the middle frame 8 away from the cover plate 6, thereby reducing the frame of the display device.

Figure 4:
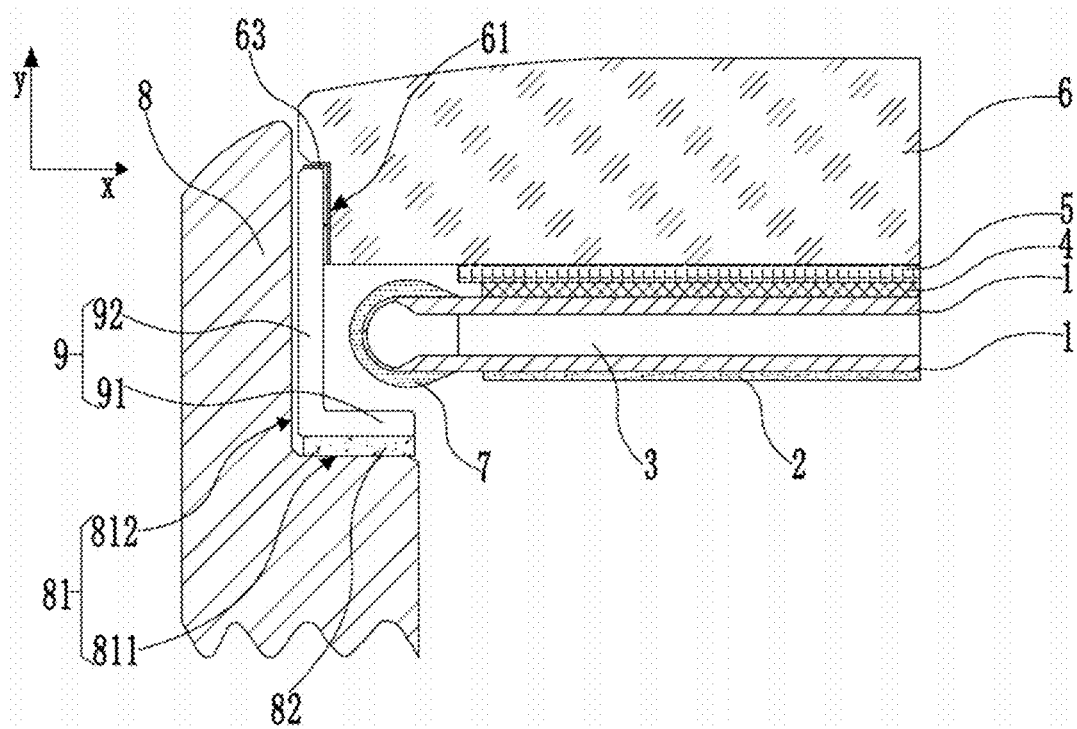
FIG. 4 is a partial schematic diagram of another display device involved in an embodiment of the present disclosure.

As shown in FIG. 4, a side surface of the middle frame 8 close to the display panel is in a stand orientation, the middle frame 8 is provided with an installation notch 81, and the display panel is arranged in the installation notch 81. The installation notch 81 includes the first mating surface 811 and the second mating surface 812. The first mating surface 811 is an end surface of the installation notch 81, and the second mating surface 812 is a side surface of the installation notch 81.

It can be understood that the second matching surface 812 is perpendicular to the first matching surface 811. More specifically, the perpendicular line of the first mating surface 811 extends along a second direction, the perpendicular line of the second mating surface 812 extends along a first direction, and the second direction is perpendicular to the first direction. The shape of the display device is not specific, it may be a prism or a cylinder, no matter the shape of the display device is a prism or a cylinder, the second mating surface 812 is not a flat surface, and thus the first direction is not a specific direction, but is an axis direction perpendicular to the second mating surface 812 and the display device. The second direction is generally the y-direction shown in FIG. 4 and the first direction may be the x-direction shown in FIG. 4.

The display substrate 1 is arranged at a side of the first mating surface 811, and the cover plate 6 is arranged at a side of the display substrate 1 away from the first mating surface 811. The side surface of the display substrate 1 and the side surface of the cover plate 6 are opposite to the second mating surface 812. The orthographic projection of the first mating surface 811 on the cover plate 6 at least partially overlaps the orthographic projection of the display substrate 1 on the cover plate 6. It can be understood that the distance between the side surface of the display substrate 1 and the second matching surface 812 is smaller than the width of the first matching surface 811.

The display device further includes the supporting member 9, one end of which is connected to a side surface of the cover plate 6, and the other end of which is connected to the first mating surface 811. The cover plate 6 and the middle frame 8 are connected together through the supporting member 9. The supporting member 9 includes the first supporting section 91 and the second supporting section 92 connected sequentially. A fourth adhesive layer 82 is provided at a side of the first supporting section 91 close to the first mating surface 811. The first supporting section 91 is adhered to the first mating surface 811 through the fourth adhesive layer 82, and the second supporting section 92 is adhered to the side surface of the cover plate 6 through the fifth adhesive layer 63.

The first mating surface 811 may be set as a stepped shape, the first supporting section 91 may be set as a stepped shape matching the shape and size of the first mating surface 811, and the stepped first mating surface 811 is matched with the stepped first supporting section 91, which effectively increases the bonding area and the pressing contact area between the middle frame 8 and the supporting member 9, and greatly enhances the connection stability between the middle frame 8 and the supporting member 9.

A first notch 61 may be provided at a position of the side surface of the cover plate 6 opposite to the second mating surface 812. The first notch 61 extends along the thickness direction of the cover plate 6. The second supporting section 92 is partly arranged in the first notch 61. The fifth adhesive layer 63 may be set on the end surface and the side surface of the first notch 61, and the second supporting section 92 is connected to the end surface and the side surface of the first notch 61 through the fifth adhesive layer 63.

It can be understood that the second supporting section 92 is arranged between the side surface of the first notch 61 and the second mating surface 812. One surface of the second supporting section 92 is attached to the second mating surface 812, and the other surface is partially attached to the side surface of the first notch 61. Generally, the thickness of the second supporting section 92 is equal to the distance between the side surface of the first notch 61 and the side surface of the cover plate 6. In order to prevent that a fitting gap exists between the cover plate 6 and the middle frame 8 and external dust enters the fitting gap, the side surface of the cover plate 6 is close to the second mating surface 812 in the thickness direction of the cover plate 6.

The smaller the distance between the side surface of the cover plate 6 and the second matching surface 812, the better, and the ideal situation is that the distance between the side surface of the cover plate 6 and the second matching surface 812 is zero. A gap is formed between the side surface of the first notch 61 and the second mating surface 812, and the second supporting section 92 is partly arranged in the gap between the first side surface and the second mating surface 812, and the thickness of the second supporting section 92 is equal to the width of the gap.

Figure 5:
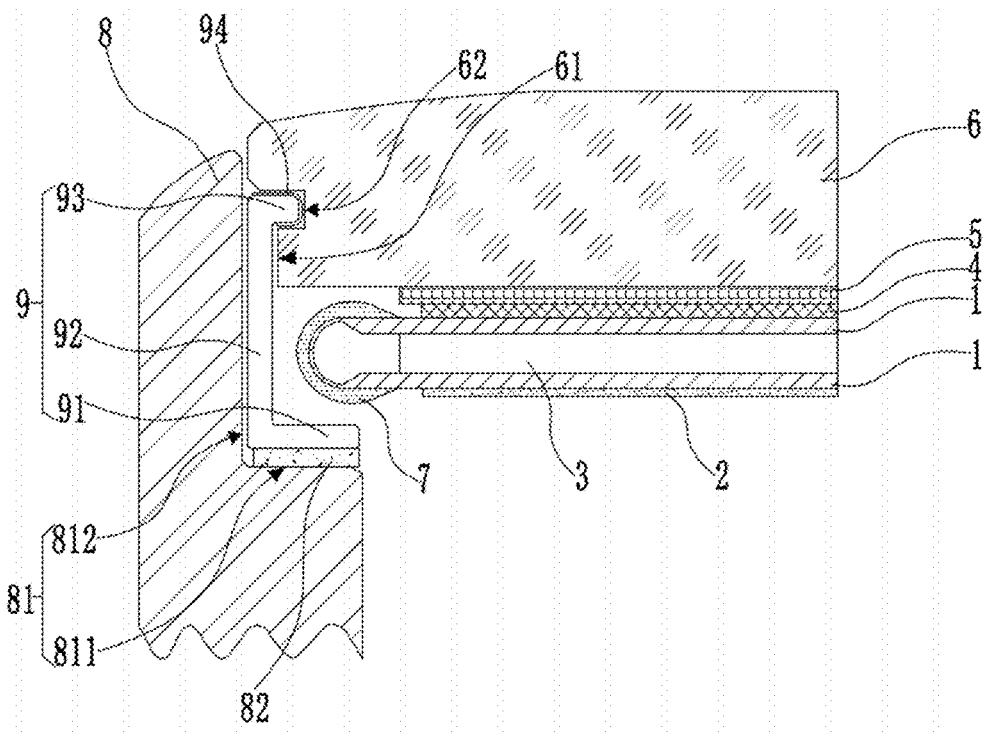
FIG. 5 is a partial schematic diagram of another display device involved in an embodiment of the present disclosure.
Figure 6:
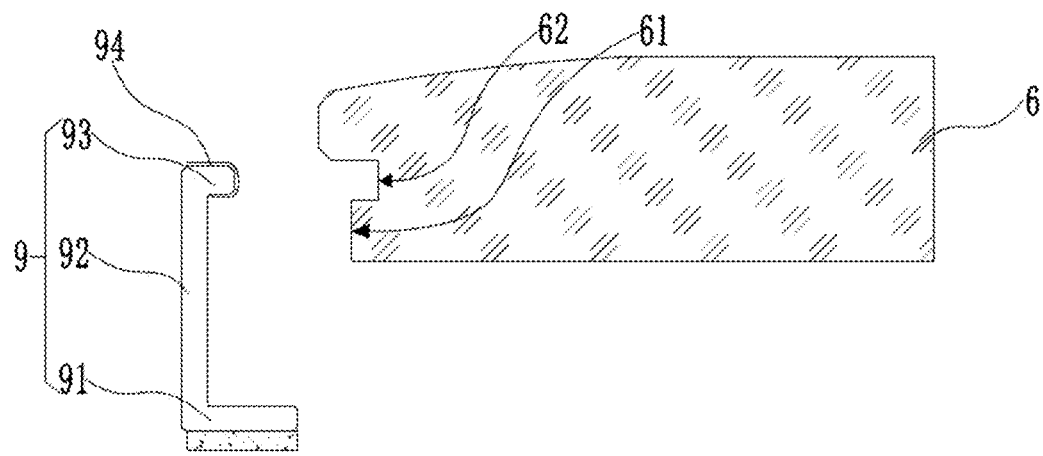
FIG. 6 is a schematic diagram showing cooperation between a supporting member and a cover plate of another display device involved in an embodiment of the present disclosure.

As shown in FIG. 5 and FIG. 6, in order to prevent the connection between the second section and the first notch 61 from becoming loose (which may result in peeling between the display panel and the middle frame 8) when the display device is subjected to frequent vibrations, the side surface of the first notch 61 is also provided with a second notch 62. The second notch 62 extends perpendicular to the thickness direction of the cover plate 6. The supporting member 9 also includes a third supporting section 93. The third supporting section 93 is connected to an end away from the first supporting section 91. The third supporting section 93 is snap-fitted in the second notch 62. Through the cooperation between the third supporting section 93 and the second notch 62, the movement of the cover plate 6 in the thickness direction thereof can be restricted.

However, the hardness and wear resistance of the cover plate 6 are usually smaller than those of the supporting member 9. In order to prevent the supporting member 9 from directly contacting the cover plate 6 and affecting the strength of the cover plate 6, the cross-sectional shape of the second notch 62 may be set as arc-shaped, and the cross-section of the third supporting section 93 is set as an arc shape matching the shape and size of the second notch 62. When the display device is vibrated, the contact area between the first section and the second notch 62 may be increased, thereby making the cover plate 6 not easily damaged.

A flexible buffer layer 94 may also be provided between the third supporting section 93 and the second notch 62. The material of the flexible buffer layer 94 is usually an elastic material that deforms after being subjected to a force and returns to its original state after the force disappears, and specifically the material of the flexible buffer layer 94 may be foam. It can be understood that the foam is only an example of the flexible buffer layer 94, and does not constitute a limitation to the flexible buffer layer 94.

The first supporting section 91 is connected to the first mating surface 811 and spaced apart from the display substrate 1. Specifically, the display substrate 1 has a display region and a binding region located in the periphery of the display region. The orthographic projection of the first mating surface 811 on the cover plate 6 at least partially overlaps the orthographic projection of the binding region on the cover plate 6. The supporting member 9 may play a certain protective role below the binding region, preventing the pressure generated by external impact during the assembly process from being transmitted to the binding region (which may result in poor display of the display panel).

Figure 7:
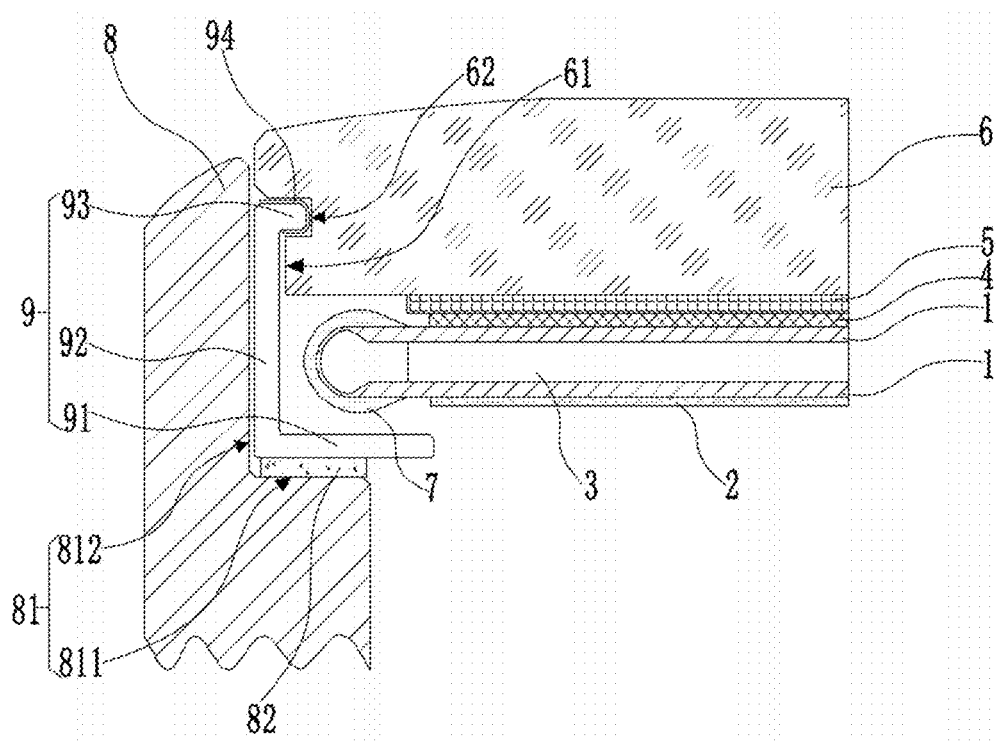
FIG. 7 is a partial schematic diagram of another display device involved in an embodiment of the present disclosure after the width of a first supporting section is increased.

As shown in FIG. 7, in order to better protect the binding region of the display panel, the width of the first supporting section 91 may be increased. Specifically, the width of the first supporting section 91 is set to be greater than or equal to the width of the first mating surface 81. It needs to be at least ensured that the orthographic projection of the binding region on the cover plate 6 is located within the orthographic projection of the first supporting section 91 on the cover plate 6.

In addition, the depth of the second notch 62 along the first direction should be as small as possible under the condition that the position of the third supporting section 93 in the second direction can be limited. The advantage of this arrangement is that, on the one hand, such arrangement can reduce the impact of the second notch 62 on the strength of the cover plate 6, and on the other hand, such arrangement can prevent the second notch 62 from extending to the display region of the display panel (which will affect the display effect of the display panel).

The depth of the second notch 62 is generally smaller than the width of the first mating surface 811, while the width of the third supporting section 93 is usually equal to the depth of the second notch 62, and the width of the first supporting section 91 is usually equal to the width of the first mating surface 811. Therefore, the width of the third supporting section 93 is generally smaller than the width of the first supporting section 91. It should be noted that the width of the first supporting section 91 here refers to the length of the first supporting section 91 extending along the first direction, the width of the third supporting section 93 refers to the length of the third supporting section 93 extending along the first direction, and the width of the first mating surface 811 refers to the length of the first mating surface 811 extending along the first direction.

It should be noted that the thicknesses of the first supporting section 91, the second supporting section 92 and the third supporting section 93 of the supporting member 9 are generally equal. The supporting member 9 adopts a material which has good strength and may be processed into an ultra-thin structural member. For example, the material of the supporting member 9 is stainless steel.

Figure 8:
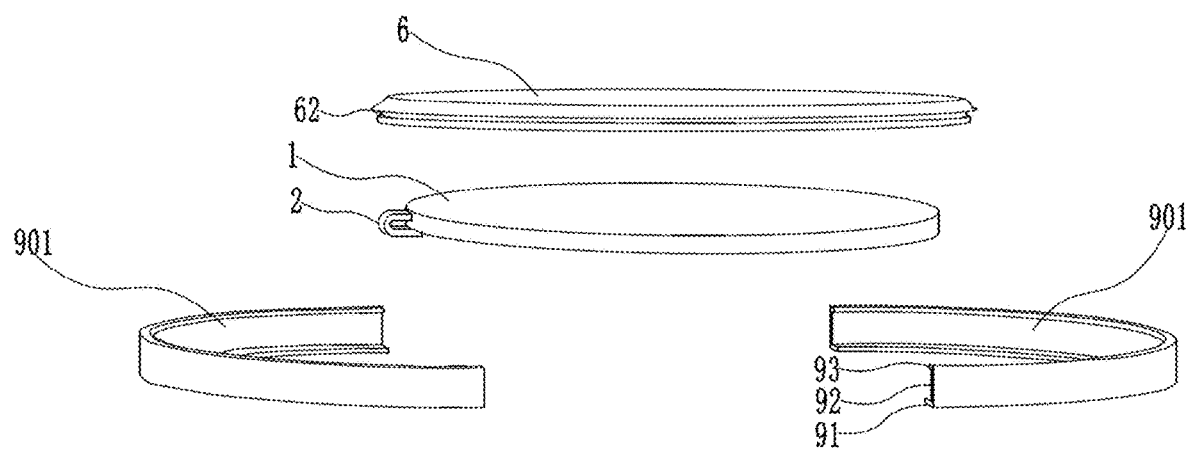
FIG. 8 is a three-dimensional structure diagram of another display device involved in an embodiment of the present disclosure.

As shown in FIG. 8, in order to facilitate the assembly of the supporting member 9 with the cover plate 6 and the middle frame 8, the supporting member 9 may be divided into two parts along the extending direction of the first side surface. The two parts of the supporting member 9 are respectively connected to the cover plate 6 and the middle frame 8. Especially, when the third supporting section 93 of the supporting member 9 is connected to the second notch 62, the third supporting section 92 may be snapped into the second notch 62 without changing the relative position of the third supporting section 93 and the second supporting section 92.

The two parts of the supporting member 9 may be the same or not. For example, the supporting member 9 may include two identical supporting units 901. When the supporting member 9 is connected to the cover plate 6 and the middle frame 8, one of the supporting units 901 may be connected to the first notch 61, the second notch 62 and the first notch 62, and then the other one of the supporting units 901 may be connected to the first notch 61, the second notch 62 and the first mating surface 811.

Figure 9:
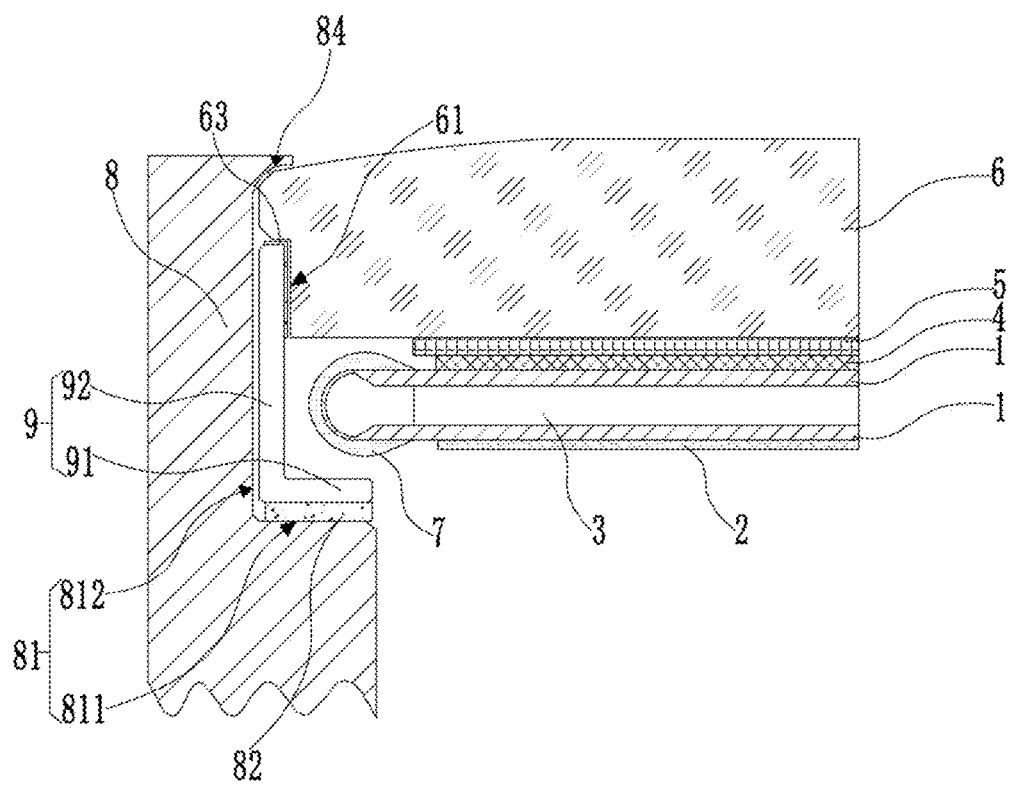
FIG. 9 is a partial schematic diagram of another display device involved in an embodiment of the present disclosure.

As shown in FIG. 9, in other possible implementations, the installation notch 81 may be set as a groove-like structure, that is, the middle frame 8 is provided with a limiting portion that cooperates with a surface of the cover plate 6 away from the first mating surface 811. The limiting portion prevents peeling of the display panel along the direction away from the first mating surface 811. The second supporting section 92 may cooperate with the end surface of the first notch 61 to prevent the display panel from peeling along the direction close to the first matching surface 811. It can be understood that the movement of the cover plate 6 in its thickness direction may be limited by the cooperation between the limiting portion and the second supporting section 92.

The second notch 62 extends continuously along the extending direction of the edge of the cover plate 6, and the length of the third supporting section 93 along the first direction is the same and equal to the length of the second notch 62. In other possible implementations, the second notch 62 includes a plurality of recesses, and the plurality of recesses are distributed at intervals along the extension direction of the side surface of the cover plate 6. The third supporting section 93 includes a plurality of protrusions arranged at intervals. The size and shape of each of the protrusions match the size and shape of a corresponding recess, and each of the protrusions is arranged in a corresponding recess.

The cover plate 6 may be a glass cover plate, the central portion of the cover plate 6 is flat, and the edge portion of the cover plate 6 is arc-shaped along the direction away from the central portion. The edge portion is bent towards the lower surface of the glass cover plate 6 along the direction away from the central portion. The middle frame 8 fits with the edge portion in a direction away from the central portion. It should be noted that the edge portion may be bent towards the lower surface of the cover plate 6 as a whole, or only the upper surface of the edge portion may be bent towards the lower surface of the cover plate 6. In this embodiment, the upper surface of the cover plate 6 refers to the surface away from the display substrate 1, which is also the surface directly faced by a user during usage. The lower surface of the cover plate 6 refers to the surface close to the display substrate 1, i.e., the surface away from the user.

Figure 10:
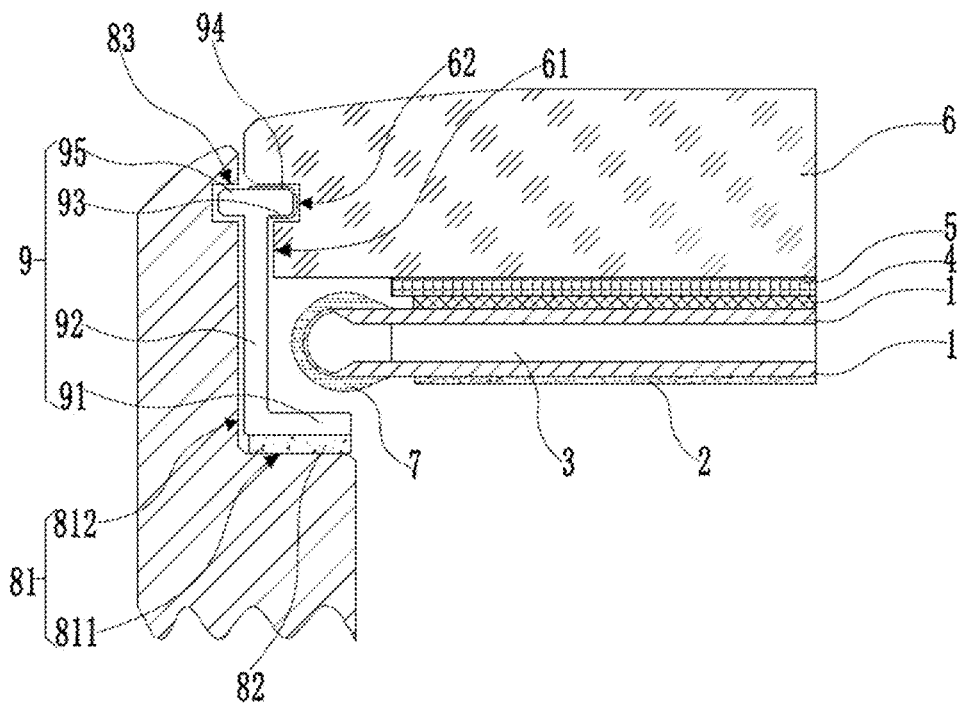
FIG. 10 is a partial schematic diagram of another display device involved in an embodiment of the present disclosure.

As shown in FIG. 10, in order to further fix the relative position between the display panel and the middle frame 8 in the second direction, a third notch 83 may be provided on the second mating surface 812. The third notch 83 and the second notch 62 are in the same straight line. The supporting member 9 further includes a fourth supporting section 95. The fourth supporting section 95 is snap-fitted in the third notch 83. The first supporting section 91 cooperates with the first mating surface 811 to define the relative position of one end of the supporting member 9 and the middle frame 8, and the fourth supporting section 95 cooperates with the third notch 83 to define the relative position of the other end of the supporting member 9 and the middle frame 8, so as to ensure that the supporting member 9 will not move relative to the middle frame 8 in the second direction. It can be understood that if the position of the supporting member 9 is fixed, the position of the cover plate 6 is naturally fixed.

The middle frame 2 may be set as an integral structure or a spliced structure. When the middle frame 2 is set as an integral structure, it is needed to ensure that the supporting member 9 has a certain amount of deformation. After the supporting member 9 is connected to the cover plate 6, the supporting member 9 is connected to the middle frame 8. The fourth supporting section 95 is bent to be substantially parallel to the second supporting section 92, and the supporting member 9 is slid in along the second mating surface 812. When the fourth supporting section 95 is aligned with the third notch 83, the fourth supporting section 95 is restored to be perpendicular to the second supporting section 92 and snapped into the third notch.

It should be noted that, in addition to the middle frame and the display panel, the display device also includes other necessary components and elements, such as housing, circuit board(s), power line(s), and so on. One of ordinary skill in this art can appreciate other supplements according to specific usage requirements of the display device, and details will not be repeated here.

The display device may be a traditional electronic device, such as a mobile phone, a watch, a computer, a TV or a video recorder, or an emerging wearable device, such as VR glasses, which are not listed here.

Figure 11:
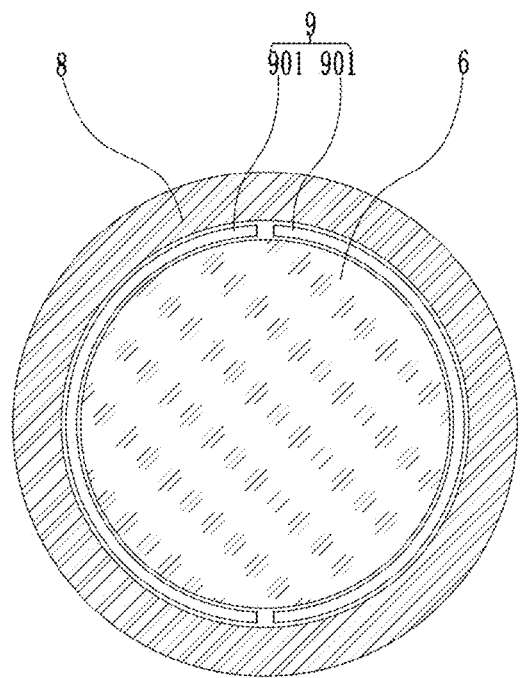
FIG. 11 is a cross-sectional view along a first direction of another circular display device involved in an embodiment of the present disclosure.
Figure 12:
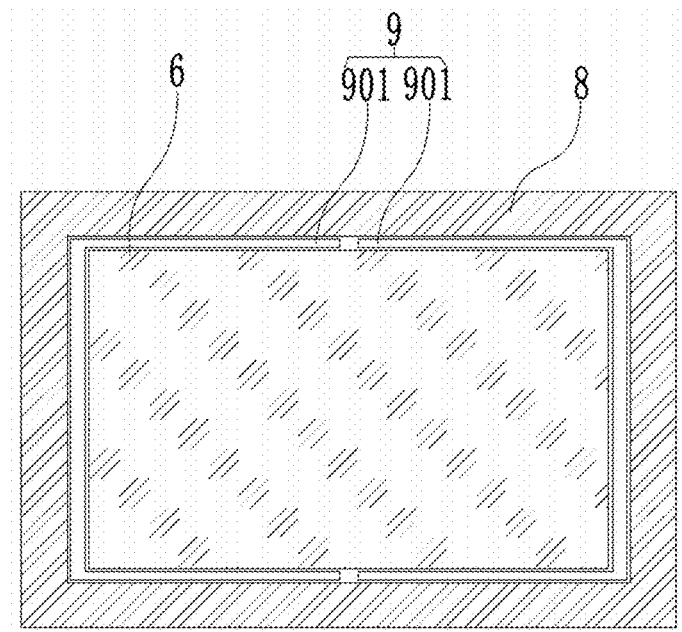
FIG. 12 is a cross-sectional view along a first direction of another rectangular display device involved in an embodiment of the present disclosure.

As shown in FIG. 11 and FIG. 12, display device may be set as circular, then the shape of the cover plate 6 of the display device is circular, the shape of the middle frame 8 of the display device is ring-shaped. The supporting member 9 of the display device 9 includes two half-ring shaped supporting units 901. Or, the display device may be set as rectangle, then the shape of the cover plate 6 of the display device is rectangle, and the shape of the middle frame 8 of the display device is a rectangular frame. The supporting member 9 of the display device includes two supporting units 901 of semi-rectangular frame structures. When the shape of the display device is circular, the display device may be a watch or VR glasses, when the shape of the display device is rectangular, the display device may be a mobile phone or a computer.

The present disclosure will be readily apparent to those skilled in the art from consideration of the specification and practice of the invention disclosed herein. The present disclosure is intended to cover any modification, use or adaptation of the present disclosure, and these modifications, uses or adaptations follow the general principles of the present disclosure and include common knowledge or conventional technical means in the technical field not disclosed in the present disclosure. The specification and embodiments are to be considered as exemplary only, with the true scope and spirit of the present disclosure indicated by the appended claims.

What is claimed is:

1. A display device, comprising:
    a middle frame provided with a first mating surface;
    a display panel comprising a display substrate and a cover plate arranged on a side of the display substrate, wherein a first notch is provided at a side of an edge of the cover plate close to the first mating surface, the first notch extends along a thickness direction of the cover plate, and an orthographic projection of the display substrate on the cover plate at least partially overlaps an orthographic projection of the first mating surface on the cover plate; and
    a supporting member comprising a first supporting section and a second supporting section which are connected sequentially, wherein the first supporting section is connected to the first mating surface, and the second supporting section is partially arranged in the first notch;
    wherein a second notch is provided at a side of the first notch, the second notch extends perpendicular to a thickness direction of the cover plate, and the supporting member further comprises a third supporting section which is connected to an end away from the first supporting section, and the third supporting section is snap-fitted in the second notch; and
    wherein a third notch is provided at a second mating surface, and the supporting member further comprises a fourth supporting section, and the fourth supporting section is snap-fitted in the third notch.

2. The display device according to claim 1, wherein the middle frame further comprises the second mating surface, and a gap is formed between a side surface of the first notch and the second mating surface, and the second supporting section is partly arranged in the gap, and a thickness of the second supporting section is equal to a width of the gap.

3. The display device according to claim 1, wherein the first supporting section is spaced apart from the display substrate.

4. The display device according to claim 3, wherein the display substrate has a display region and a binding region located at a periphery of the display region, and the orthographic projection of the first mating surface on the cover plate at least partially overlaps an orthographic projection of the binding region on the cover plate.

5. The display device according to claim 4, wherein a width of the first supporting section is greater than or equal to a width of the first mating surface, and the orthographic projection of the binding region on the cover plate is located in an orthographic projection of the first supporting section on the cover plate.

6. The display device according to claim 1, wherein a width of the third supporting section is smaller than a width of the first supporting section.

7. The display device according to claim 1, wherein:
    the middle frame is provided with an installation notch, the cover plate is arranged in the installation notch, and the first mating surface is an end surface of the installation notch; and
    the middle frame further comprises the second mating surface, the second mating surface is a side surface of the installation notch, and the first notch and the second notch are arranged at a position of the side surface of the cover plate which is opposite to the second mating surface.

8. The display device according to claim 1, wherein the supporting member is attached to a side surface of the first notch and divided into at least two parts along an extending direction of the side surface.

9. The display device according to claim 1, wherein a flexible buffer layer is provided between the third supporting section and the second notch.

10. The display device according to claim 1, wherein the supporting member is made of stainless steel.

11. The display device according to claim 1, wherein the second notch extends continuously along an extending direction of an edge of the cover plate.

12. The display device according to claim 1, wherein the second notch comprises a plurality of recesses, and the plurality of recesses are distributed at intervals along the extending direction of the side surface of the cover plate.

13. The display device according to claim 1, wherein the edge of the cover plate is arc-shaped, and a height of the edge of the cover plate away from the first mating surface is gradually decreased from an end close to a center of the cover plate to an end away from the center.

14. The display device according to claim 1, wherein the first supporting section is adhered to the first mating surface.

15. The display device according to claim 1, wherein the third notch and the second notch are located in a same straight line.

16. The display device according to claim 1, wherein a limiting portion is arranged on the middle frame to prevent the display panel from moving along a direction away from the first mating surface.

* * * * *